(12) United States Patent
Lee

(10) Patent No.: US 10,827,657 B2
(45) Date of Patent: Nov. 3, 2020

(54) DISPLAY SYSTEM WITH CANOPY

(71) Applicant: KEYSER INDUSTRIES, INC., Evergreen Park, IL (US)

(72) Inventor: Nick Lee, Milton, WI (US)

(73) Assignee: Keyser Industries Inc., Evergreen Park, IL (US)

( * ) Notice: Subject to any disclaimer, the term of this patent is extended or adjusted under 35 U.S.C. 154(b) by 0 days.

(21) Appl. No.: 16/431,058

(22) Filed: Jun. 4, 2019

(65) Prior Publication Data

US 2019/0289756 A1 Sep. 19, 2019

Related U.S. Application Data

(60) Continuation-in-part of application No. 16/274,083, filed on Feb. 12, 2019, which is a division of
(Continued)

(51) Int. Cl.
*H05K 7/20* (2006.01)
*G09F 23/06* (2006.01)
(Continued)

(52) U.S. Cl.
CPC ... *H05K 7/20972* (2013.01); *G02F 1/133308* (2013.01); *G02F 1/133385* (2013.01);
(Continued)

(58) Field of Classification Search
CPC . G06F 1/20; G06F 1/181; G06F 1/183; G06F 1/206; G06F 1/188;
(Continued)

(56) References Cited

U.S. PATENT DOCUMENTS

| | | | |
|---|---|---|---|
| 6,226,165 B1 * | 5/2001 | Collins | E05B 73/0082 361/1 |
| 2007/0011924 A1 * | 1/2007 | Dana | G09F 11/00 40/454 |

(Continued)

OTHER PUBLICATIONS

Permit Solutions, Inc. McDonald's Remodel—Signage Package, City of Dublin Planning Department, ownloaded Oct. 22, 2018, 12 total pages, p. 11, Everbrite LLC, canopy on a different display system, City of Dublin—Planning Department, 5800 Shier Rings Rd., Dublin, OH 43016.

*Primary Examiner* — Mandeep S Buttar
(74) *Attorney, Agent, or Firm* — David C. Brezina

(57) ABSTRACT

A display system including an upright column, tower or pedestal meeting IP56 weatherproofing standards and including a first vent and a second vent positioned vertically above the first vent, a mounting arm coupled to the upright column, tower or pedestal, an industrial PC mounted within the upright column, tower or pedestal between the first vent and the second vent, a fan mounted within the upright column, tower or pedestal adjacent the first vent, a thermostat mounted within the upright column, tower or pedestal and controlling the fan continuously at or above a non-zero minimum speed so that a positive pressure is maintained within the upright column, tower or pedestal between the first vent and the second vent, and a large format display mounted to the mounting arm and receiving signals from the industrial PC, the upright column, tower or pedestal extending upwardly to support a canopy and the vents being mounted in an openable plate.

17 Claims, 21 Drawing Sheets

Related U.S. Application Data application No. 15/673,193, filed on Aug. 9, 2017, now Pat. No. 10,244,669.

(60) Provisional application No. 62/373,079, filed on Aug. 10, 2016.

(51) Int. Cl.

| | | |
|---|---|---|
| *G09F 9/302* | (2006.01) | |
| *G09F 27/00* | (2006.01) | |
| *G02F 1/1333* | (2006.01) | |
| *H02B 1/28* | (2006.01) | |
| *G09F 19/22* | (2006.01) | |

(52) U.S. Cl.
CPC ............ *G09F 9/3026* (2013.01); *G09F 19/22* (2013.01); *G09F 23/06* (2013.01); *G09F 27/005* (2013.01); *H02B 1/28* (2013.01); *H05K 7/20209* (2013.01); *G02F 2001/133311* (2013.01)

(58) Field of Classification Search
CPC .......... G06F 2200/201; H05K 7/20145; H05K 7/20209; H05K 7/20745; H05K 1/0203; H05K 7/20754; H05K 5/0213; G02F 1/133308; G02F 1/133385; G02F 2001/133311; G09F 19/22; G09F 9/3026; G09F 27/00

USPC ......... 361/695, 679.48, 679.46, 679.47, 690, 361/678, 694; 454/184, 188, 254; 165/104.33, 80.3

See application file for complete search history.

(56) References Cited

U.S. PATENT DOCUMENTS

| | | | | |
|---|---|---|---|---|
| 2007/0097609 | A1* | 5/2007 | Moscovitch | G06F 3/1431 361/679.04 |
| 2008/0236005 | A1* | 10/2008 | Isayev | G09F 13/04 40/574 |
| 2012/0223877 | A1* | 9/2012 | Cho | H05K 7/20972 345/102 |
| 2013/0241485 | A1* | 9/2013 | Snyder | B60L 1/02 320/109 |
| 2016/0102645 | A1* | 4/2016 | Henley | F02N 19/02 219/205 |
| 2016/0324040 | A1* | 11/2016 | Bouissiere | H05K 7/20972 |
| 2017/0018952 | A1* | 1/2017 | Finckh | F16M 11/2021 |
| 2017/0172016 | A1* | 6/2017 | Kang | H05K 5/0213 |
| 2018/0041731 | A1* | 2/2018 | Yu | G06F 21/44 |

* cited by examiner

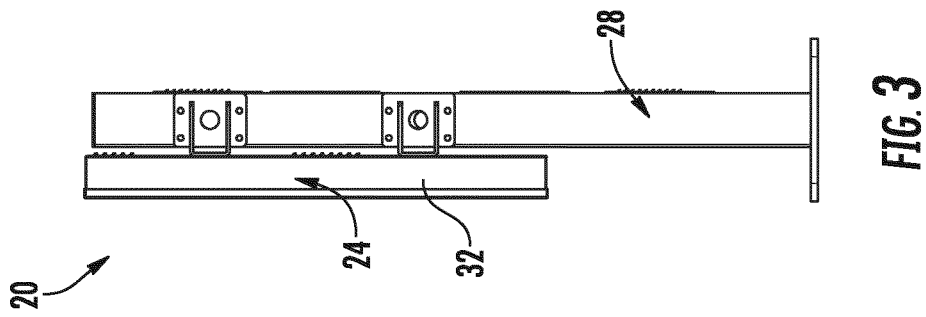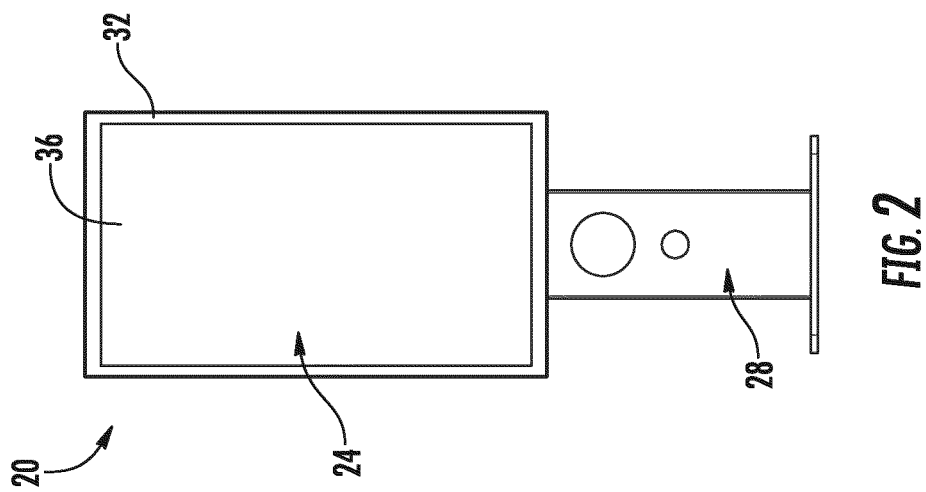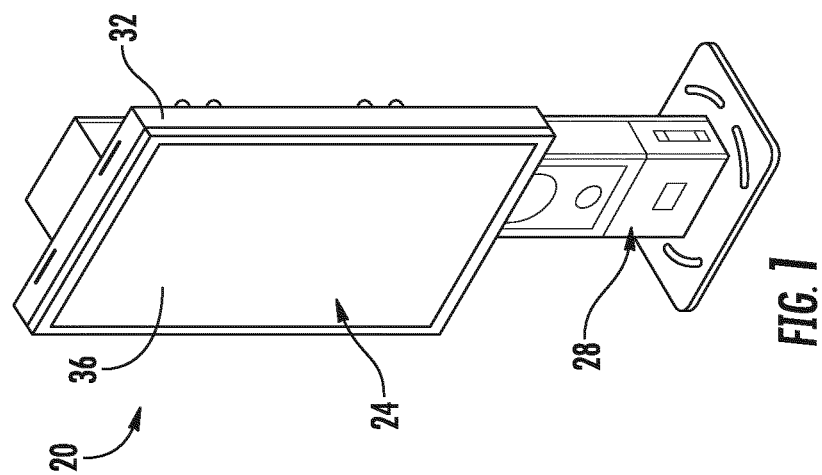

DISPLAY SYSTEM WITH CANOPY

CLAIM OF PRIORITY

This application is a Continuation In Part application from copending U.S. patent application Ser. No. 16/274,083, itself a Divisional Application from U.S. patent application Ser. No. 15/673,193, claiming priority on Provisional Application 62/373,079

FIELD OF THE INVENTION

The present invention relates to a display system and more particularly to a display system providing a weather resistant mounting for use in presenting electronic displays exposed to weather.

BACKGROUND

The present invention relates generally to display systems. More specifically, the present invention relates to display systems for use outside. Structural and ease of installation advantages are provided by having vertical vents in an openable and closable plate member. Outside use is enhanced by extending a housing upwardly and mounting a cantilevered canopy thereon.

SUMMARY OF THE INVENTION

One embodiment a display system includes a support system, a large format display supported by the support system, and a control system housed within the support system. In one embodiment, the support system is a column that may be arranged to support the large format display. In some embodiments, the display system includes a second large format display. In some embodiments, the column is arranged to support one or two large format displays. In some embodiments, the control system includes fans mounted within the support system. In some embodiments, the fans run substantially continuously. In one embodiment, the support system meets IP56 weatherproofing standards.

In some embodiments, a display system includes an upright column, tower pedestal or meeting IP56 weatherproofing standards and including a first vent and a second vent positioned vertically above the first vent, a mounting arm coupled to the upright column, tower or pedestal, an industrial PC mounted within the upright column, tower or pedestal between the first vent and the second vent, a fan mounted within the upright column, tower or pedestal adjacent the first vent, a thermostat mounted within the upright column, tower or pedestal and controlling the fan continuously at or above a non-zero minimum speed so that a positive pressure is maintained within the upright column, tower or pedestal between the first vent and the second vent, and a large format display mounted to the mounting arm and receiving signals from the industrial PC.

In some embodiments, a display system includes an upright column, tower or pedestal meeting IP56 weatherproofing standards and including a vent, a mounting arm coupled to the upright column, tower or pedestal, a controller mounted within the upright column, tower or pedestal above the vent, a continuously operational fan mounted within the upright column, tower or pedestal adjacent the vent, and a large format display mounted to the mounting arm and receiving signals from the controller.

In some embodiments, a display system includes a housing configured to support one or more large format displays, a controller mounted within the housing and configured to send display signals to the one or more large format displays, and a fan mounted within the housing and positioned vertically below the controller, the fan operating continuously at or above a non-zero minimum speed to maintain a positive pressure within the housing.

In another embodiment a display system includes an upright column, tower or pedestal meeting weatherproofing standards and including an intake vent, a mounting assembly coupled to the upright column, tower or pedestal, a controller mounted within the upright column, tower or pedestal above the intake vent, a continuously operational fan mounted within the upright column, tower or pedestal adjacent the intake vent, a large format display mounted to the mounting assembly and receiving signals from the controller air passing from the intake vent, substantially vertically, to an exhaust vent, the vents being formed in or mounted to an openable and closable plate.

In yet another embodiment a display system includes an upright column, tower or pedestal meeting weatherproofing standards and including an intake vent, a mounting assembly coupled to the upright column, tower or pedestal, a controller mounted within the upright column, tower or pedestal above the intake vent, a continuously operational fan mounted within the upright column, tower or pedestal adjacent the intake vent, a large format display mounted to the mounting assembly and receiving signals from the controller air passing from the intake vent, substantially vertically, to an exhaust vent, the vents being formed in or mounted to an openable and closable plate, the column extending upwardly a height sufficient to provide vehicle clearance with a cantilevered canopy extending over the display.

There have thus been outlined, rather broadly, the more important features of the invention in order that the detailed description thereof that follows may be better understood, and in order that the present contribution of the art may be better appreciated.

Numerous aspects, features and advantages of the present invention will be readily apparent to those of ordinary skill in the art upon reading of the following detailed description of presently preferred, but nonetheless illustrative, embodiments of the present invention when taken in conjunction with the accompany drawings. In this respect, before explaining the current embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

BRIEF DESCRIPTION OF THE DRAWINGS

The invention will be better understood and aspects other than those set forth above will become apparent when consideration is given to the following detailed description thereof. Such description makes reference to the annexed drawings discussed below.

FIG. 1 is a pictorial view of a display system according to one embodiment.

FIG. 2 is a front view of the display system of FIG. 1.

FIG. 3 is a right side view of the display system of FIG. 1.

DETAILED DESCRIPTION OF THE PREFERRED EMBODIMENTS

Figure 4:
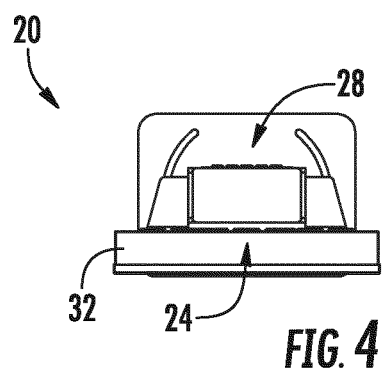
FIG. 4 is a top view of the display system of FIG. 1.
Figure 5:
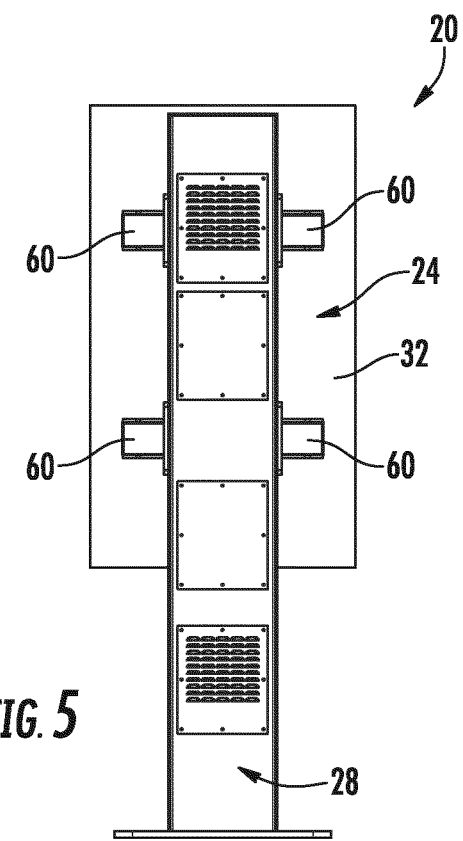
FIG. 5 is a back view of the display system of FIG. 1.
Figure 7:
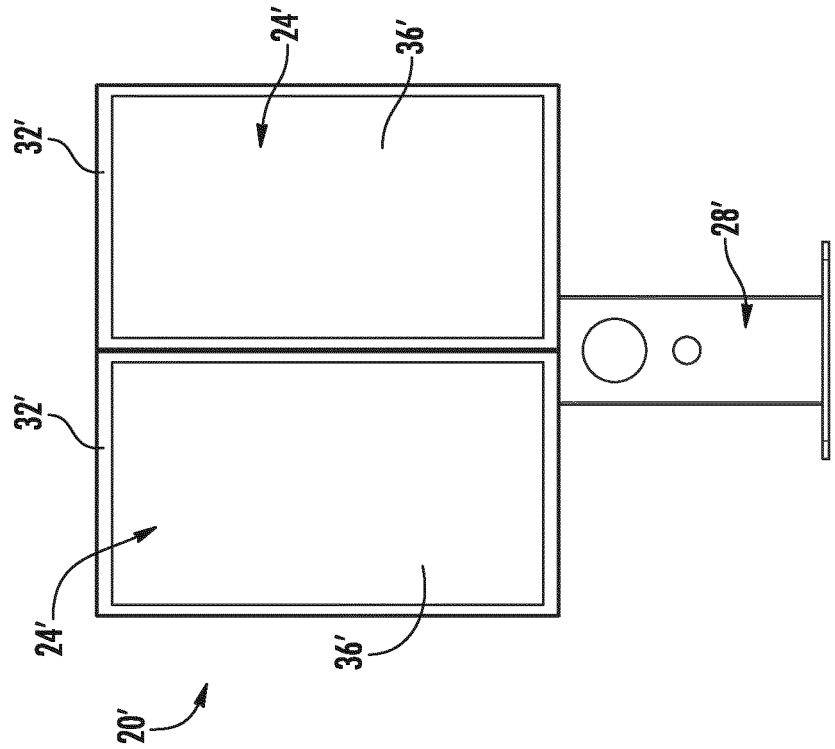
FIG. 7 is a front view of the display system of FIG. 6.
Figure 6:
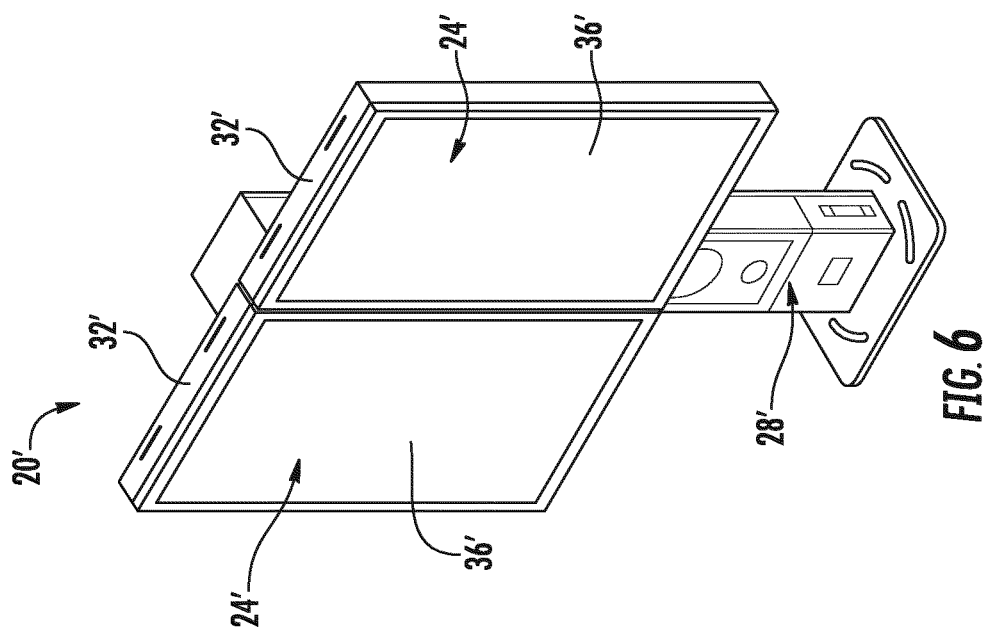
FIG. 6 is a pictorial view of another display system according to one embodiment.
Figure 8:
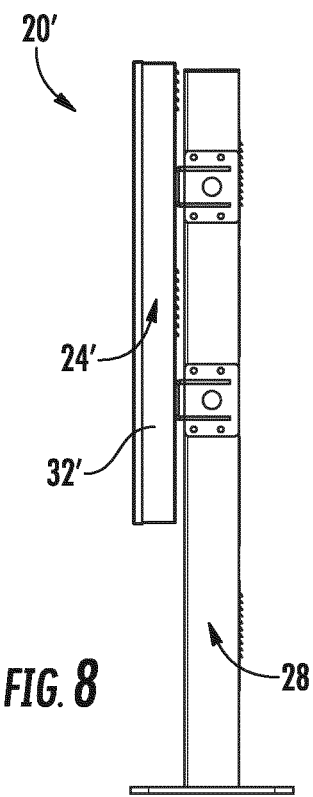
FIG. 8 is a right side view of the display system of FIG. 6.
Figure 9:
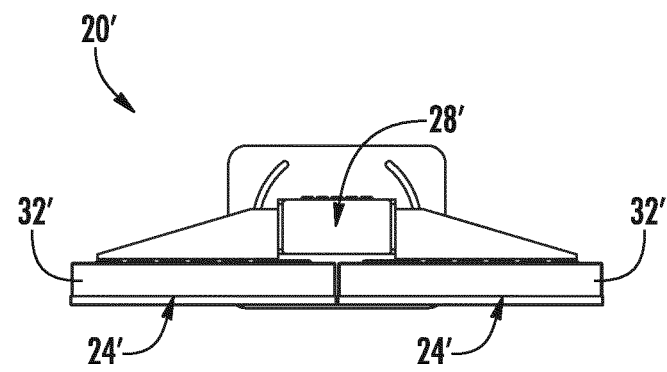
FIG. 9 is a top view of the display system of FIG. 6.
Figure 10:
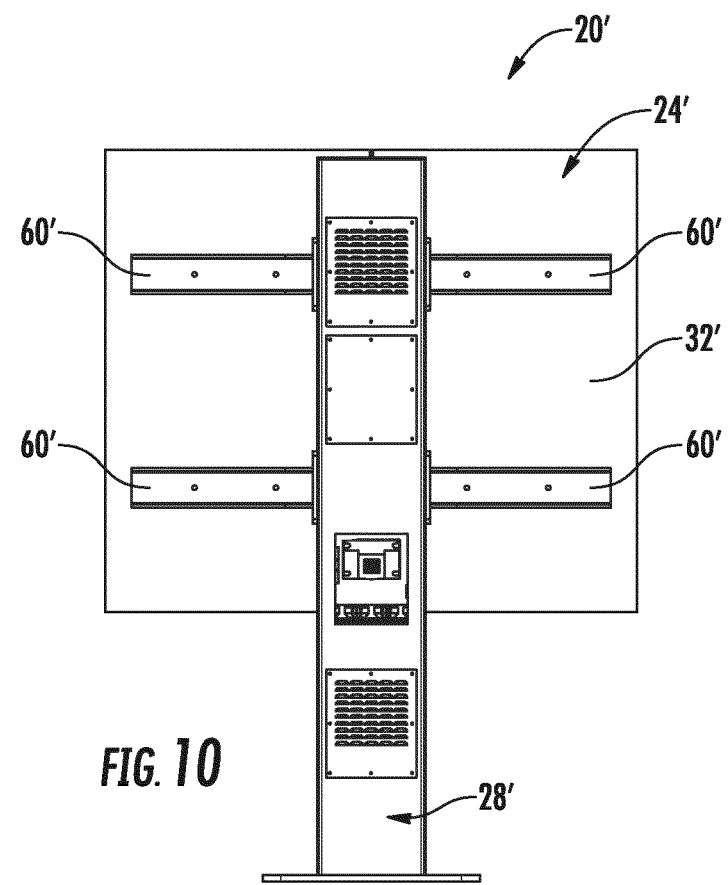
FIG. 10 is a back view of the display system of FIG. 6.
Figure 12:
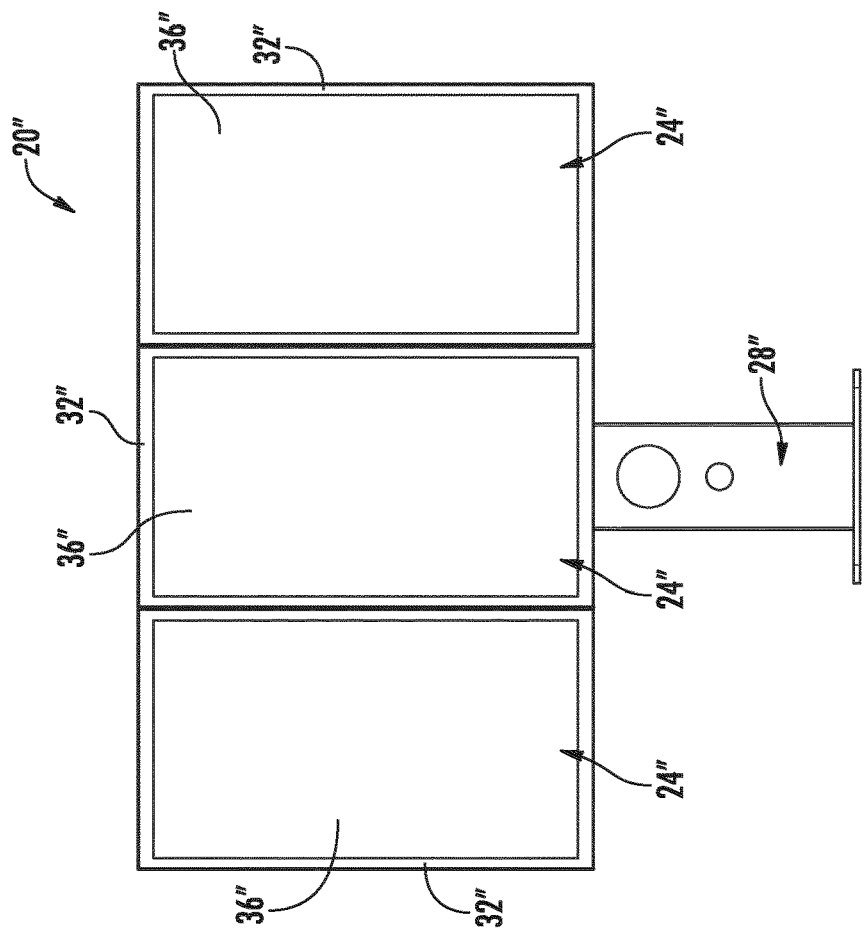
FIG. 12 is a front view of the display system of FIG. 11.
Figure 11:
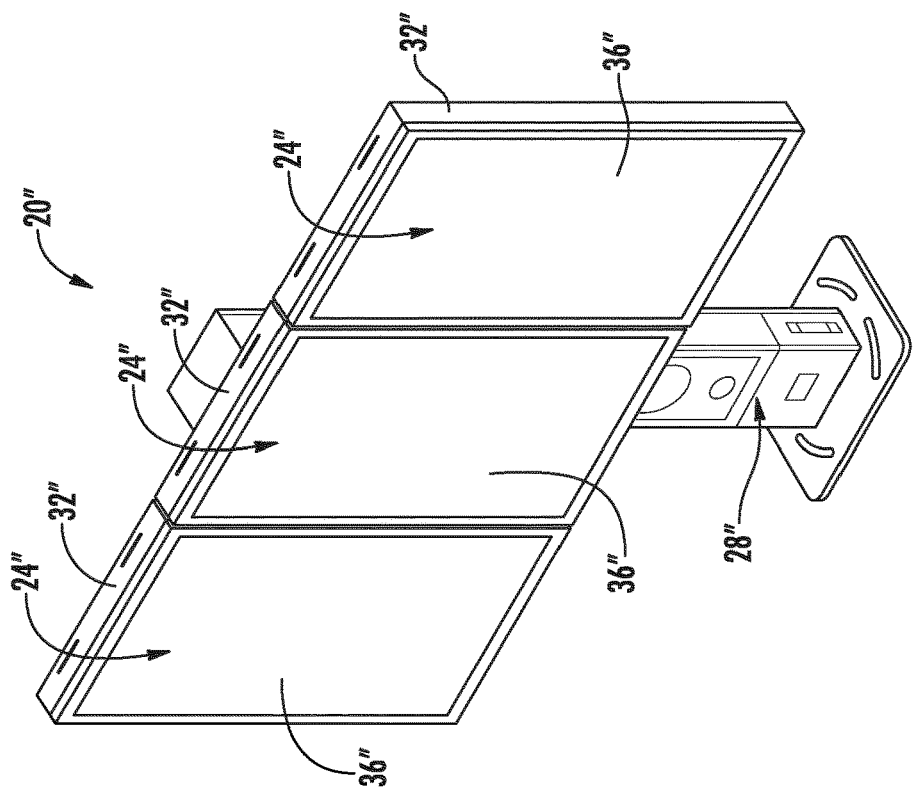
FIG. 11 is a pictorial view of another display system according to one embodiment.
Figure 13:
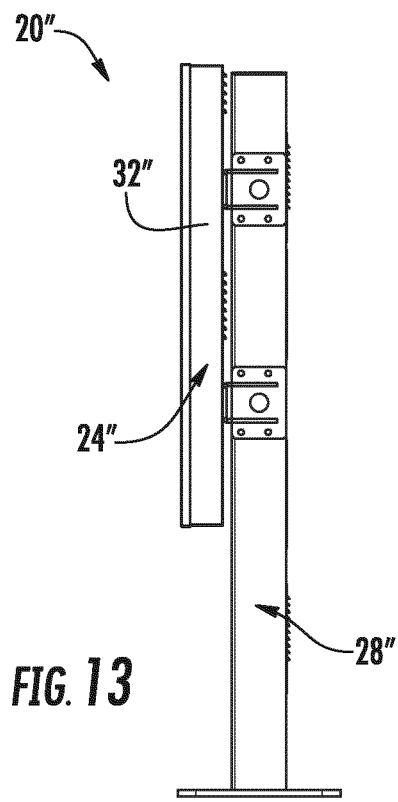
FIG. 13 is a right side view of the display system of FIG. 11.
Figure 14:
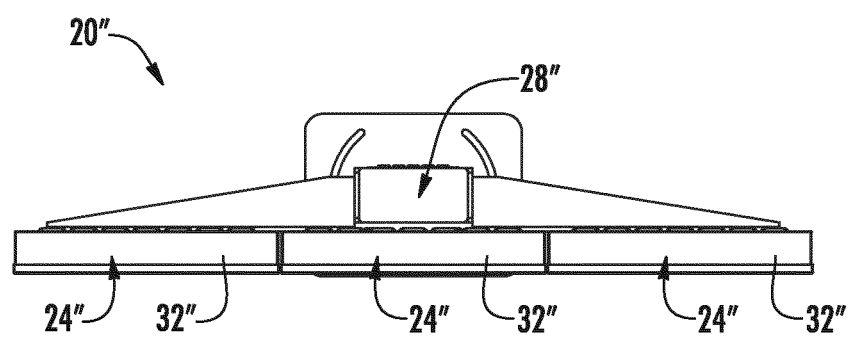
FIG. 14 is a top view of the display system of FIG. 11.
Figure 15:
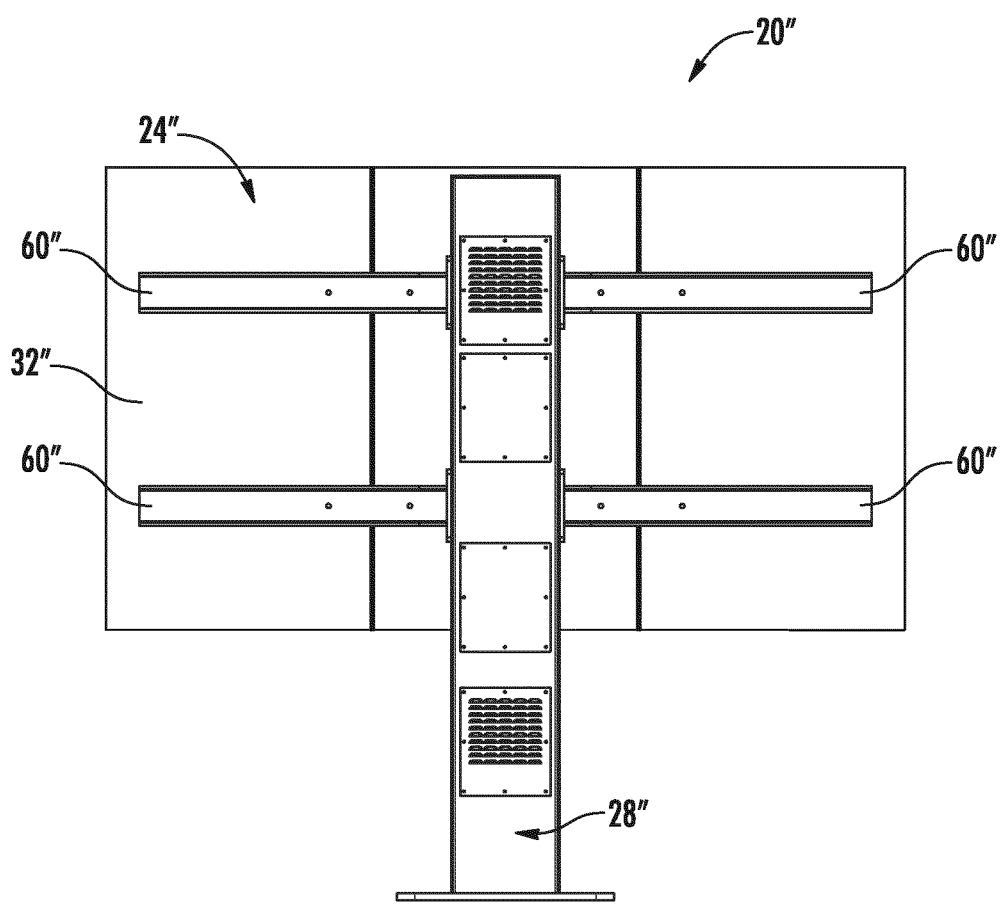
FIG. 15 is a back view of the display system of FIG. 11.

The following detailed embodiments presented herein are for illustrative purposes. That is, these detailed embodiments are intended to be exemplary of the present invention for the purposes of providing and aiding a person skilled in the pertinent art to readily understand how to make and use of the present invention. Accordingly, the detailed discussion herein of one or more embodiments is not intended, nor is to be construed, to limit the metes and bounds of the patent protection afforded the present invention, in which the scope of patent protection is intended to be defined by the claims and their equivalents thereof. Therefore, embodiments not specifically addressed herein, such as adaptations, variations, modifications, and equivalent arrangements, should be and are considered to be implicitly disclosed by the illustrative embodiments and claims described herein and therefore fall within the scope of the present invention. Further yet, the drawings are not necessarily to scale and in some instances proportions may have been exaggerated in order to more clearly depict certain features of the invention.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in this specification do not necessarily all refer to the same embodiment. Furthermore, the particular features, structures, or characteristics may be combined in any suitable manner in one or more embodiments.

Before turning to the figures, which illustrate the exemplary embodiments in detail, it should be understood that the present application is not limited to the details or methodology set forth in the description or illustrated in the figures. It should also be understood that the terminology is for the purpose of description only and should not be regarded as limiting.

Display systems are used in many situations and locations to provide information to the public or individuals. Display systems may include a programmable screen that can display video, static images, or a combination of video and static images. Display systems may be used as menu boards at quick service restaurants to provide customers with menu items or other information. In other situations, display systems may be used to display advertisements, public messages, or other information (e.g., to display a map of a train station, airport, mall, or other location, to display a directory at a hotel, movie theater, or other location, to display advertising in place of or in addition to the map or the directory).

Display systems include a screen in the form of a large format display, a support system, and a controller. Embodiments discussed below describe a display system that provides a support system that houses the controller and provides a weatherproof enclosure that meets IP56 standards.

As shown in FIGS. 1-5, a display system in the form of a 1.times.1 display system 20 that includes a large format display 24, and a support system in the form of a column 28. The large format display 24 includes a housing 32 that surrounds and encloses an LED board 36. The housing 32 is configured to provide an IP56 weatherproof rating and a communication port for communication with an outside control or video system. The LED board 36 may be a Panasonic® OMD or OHD display. In other embodiments, another brand or type of display board may be used. For example, LCD displays, plasma displays, or another display type may be used, and displays produced by other manufacturers may be used (e.g., LG®).

As shown in FIGS. 6-10, another display system in the form of a 1.times.2 display system 20' includes similar parts to the 1.times.1 display system 20 and like parts are numbered in the prime series. The 1.times.2 display system 20' include two large format displays 24' and a column 28'.

As shown in FIGS. 11-15, another display system in the form of a 1.times.3 display system 20" includes similar parts to the 1.times.1 display system 20 and like parts are numbered in the double prime series. The 1.times.3 display system 20" include three large format displays 24" and a column 28".

The display systems shown above all provide sealed large format displays that meet IP56 weatherproofing standards, and columns that also meets IP56 weatherproofing standards. The columns are arranged so that the same column can be used to support a number of different large format displays or a number of different large format display layouts. For example, in the above examples, the columns 28, 28' and 28" may be the same column that is arranged to support the three different layouts.

Figure 16:
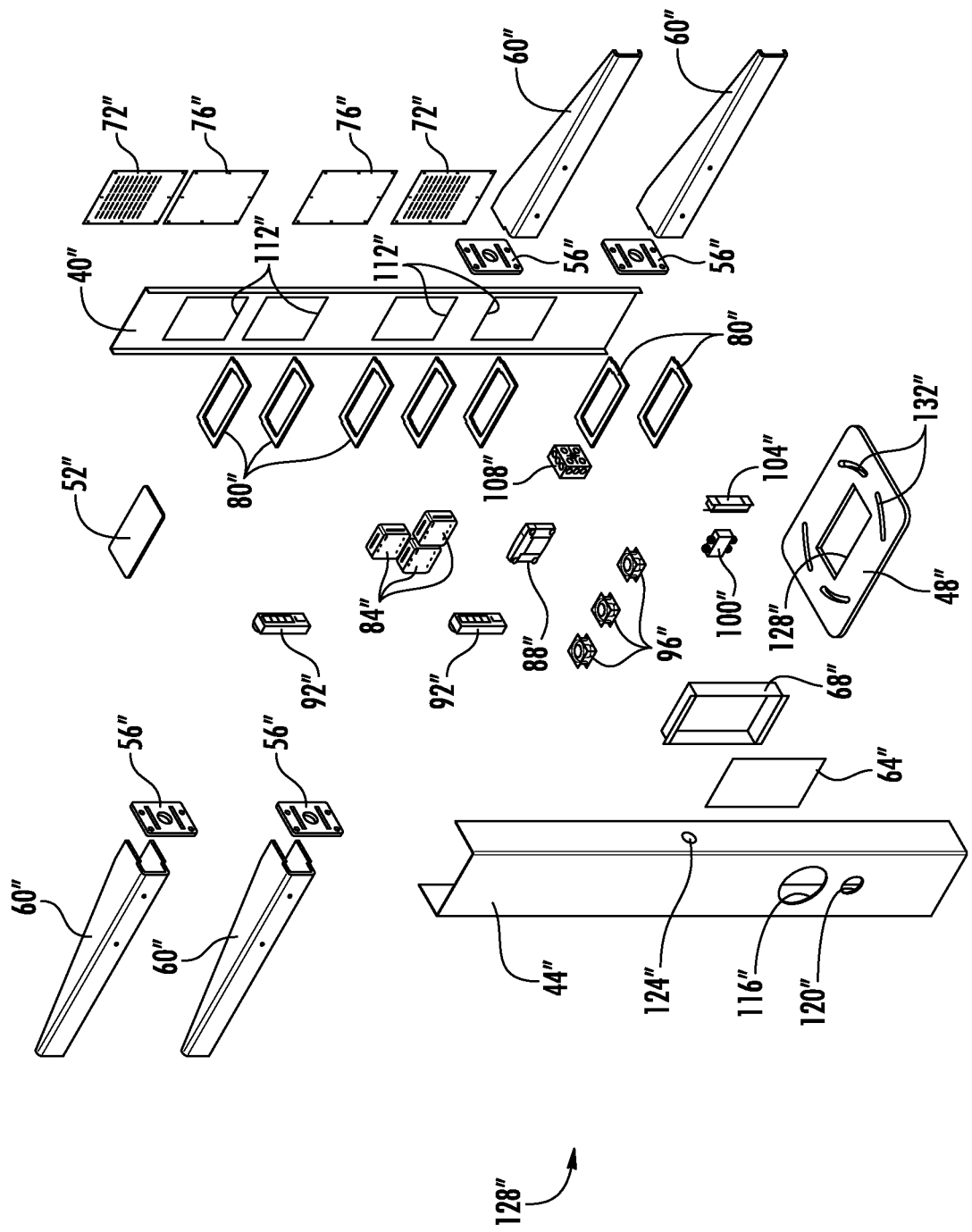
FIG. 16 is an exploded view of the display system of FIG. 1.

FIG. 16 shows the column 28" that is arranged to support three large format displays 24", and includes a main upright back 40", a main upright front 44", a base plate 48", a top cap 52", four mounting arm plates 56", four mounting arms 60", a speaker grill 64", a speaker 68", two vents 72", two cover plates 76", seven gusset plates 80", three industrial PCs 84", a network switch 88", a surge protector outlet strip 92", three cooling fans 96", a main circuit connection 100", a power supply 104", and a junction box 108".

In some embodiments, the main upright back 40" and main upright front 44" may be formed as a single piece, may be shaped differently, or may include different features, as desired. In the embodiment shown in FIG. 16, the main upright back 40" includes four vent apertures 112", and the main upright front 44" includes a communication interface in the form of a speaker aperture 116" and a microphone aperture 120". In other embodiments, the communication interface is shaped differently, include different aperture sizes, or is arranged to interact with other communication devices. For example, a keyboard, keypad, touch screen, card reader, RFID reader, joystick, or another interaction device may be used and the main upright back 40" or the main upright front 44" is arranged to support the chosen communication device. In one embodiment, a seal is provided between the main upright back 40" and the main upright front 44". The main upright front 44" also includes a communication port 124" that is positioned to provide communication with the larger format displays 24".

The base plate 48" provides an upright aperture 128" that is sized to receive the main upright back 40" and the main upright front 44". In the illustrated embodiment, the upright aperture 128" is arranged to be welded to the main upright back 40" and the main upright front 44". The upright aperture 128" may include a fillet or other features to increase the quality or ease of installation during welding. In other embodiments, the upright aperture 128" is arranged to engage the main upright back 40" and the main upright front 44" with fasteners or another way or coupling the main upright back 40" and the main upright front 44" to the base plate 48". The base plate 48" also includes anchor points 132" that are arranged to anchor the display system 20" to a surface (e.g., the ground, a concrete slab, a floor, a wall, a ceiling, etc.). In the illustrated embodiment, the anchor points 132" include apertures arranged to receive fasteners.

The top cap 52" is arranged to be welded onto the main upright back 40" and the main upright front 44". In other embodiments, the top cap 52" may be fastened to the main upright back 40" and the main upright front 44" and provide a seal.

The four mounting arm plates 56" are fastened to the main upright back 40" and the main upright front 44" either with fasteners, welding, or another coupling mechanism. In some embodiments, less than four or more than four mounting arm plates 56" may be provided. The four mounting arm plates 56" are arranged to support the four mounting arms 60".

The mounting arms 60" are sized to support three larger format displays 24". In other embodiments, the mounting arms are arranged to support a single large format display (e.g., the mounting arms 60 shown in FIG. 5), two large format displays (e.g., the mounting arms 60' shown in FIG. 10), or another layout as desired. While four mounting arms 60" are shown, they may collectively be referred to as a single mounting arm that is sized and configured to mount one or more large format displays to an upright column, tower or pedestal (e.g., the main upright front 44" and the main upright back 40").

The speaker grill 64" and the speaker box 68" are arranged to engage the speaker aperture 116" and the microphone aperture 120" and provide a speaker and a microphone that a user can interact with. In other embodiments, the speaker grill 64" and the speaker box 68" are replaced by another communication device as discussed above or eliminated.

The vents 72" engage the vent apertures 112" and provide air flow to an interior of the column 28". The cover plates 76" engage the vent apertures 112" and seal various components within the column 28". In other embodiments, more than two vents 72" or less than two vents 72" may be used. In other embodiments, more than two cover plates 76" or less than two cover plates 76" may be used.

The gusset plates 80" are arranged within the column 28" and modify an airflow within the column 28". Additionally, the gusset plates 80" are arranged to manage humidity flow or fluid flow within the column 28" such that the column 28" meets the IP56 standard.

The three industrial PCs 84" are positioned within the column 28" and each interacts with a single large format display 24" and provides information to be shown on the corresponding larger format display 24". In other embodiments, a single industrial PC 84" may provide display information to more than one large format display 24".

The network switch 88" provides communication between the industrial PCs 84" and an external or remote controller or network. The network switch 88" may provide wired or wireless communication such that the images displayed by the large format displays 24" may be controlled or manipulated.

The a surge protector outlet strip 92" provides power to the various systems within the column 28". In some embodiments, the surge protector outlet strip 92" may be replaced by a power bus, or the components may be individually wired to the power supply, or an external power source (e.g., line power).

The three cooling fans 96" are arranged adjacent the lower most vent plate 72" such that the column 28" is maintained in a generally positive pressure environment. In other words, the pressure within the column 28" is maintained above atmospheric pressure by the fans 96". The gusset plates 80" also aid the column 28" in maintaining a positive pressure environment by providing a partially reduced airflow path. The increased pressure environment reduces the likelihood of humidity and moisture infiltrating the inside of the column 28". In other embodiments, more than three or less than three fans 96" may be used.

The main circuit connection 100" is connected to an external power source such as a main power line (e.g., 110 VAC, 220 VAC) and provides power to power supply 104". The main circuit connection 100" is housed in the junction box 108". The power supply 104" receives power from the main circuit connection 100″ and converts the main power line to a DC current for use by system components.

Figure 17:
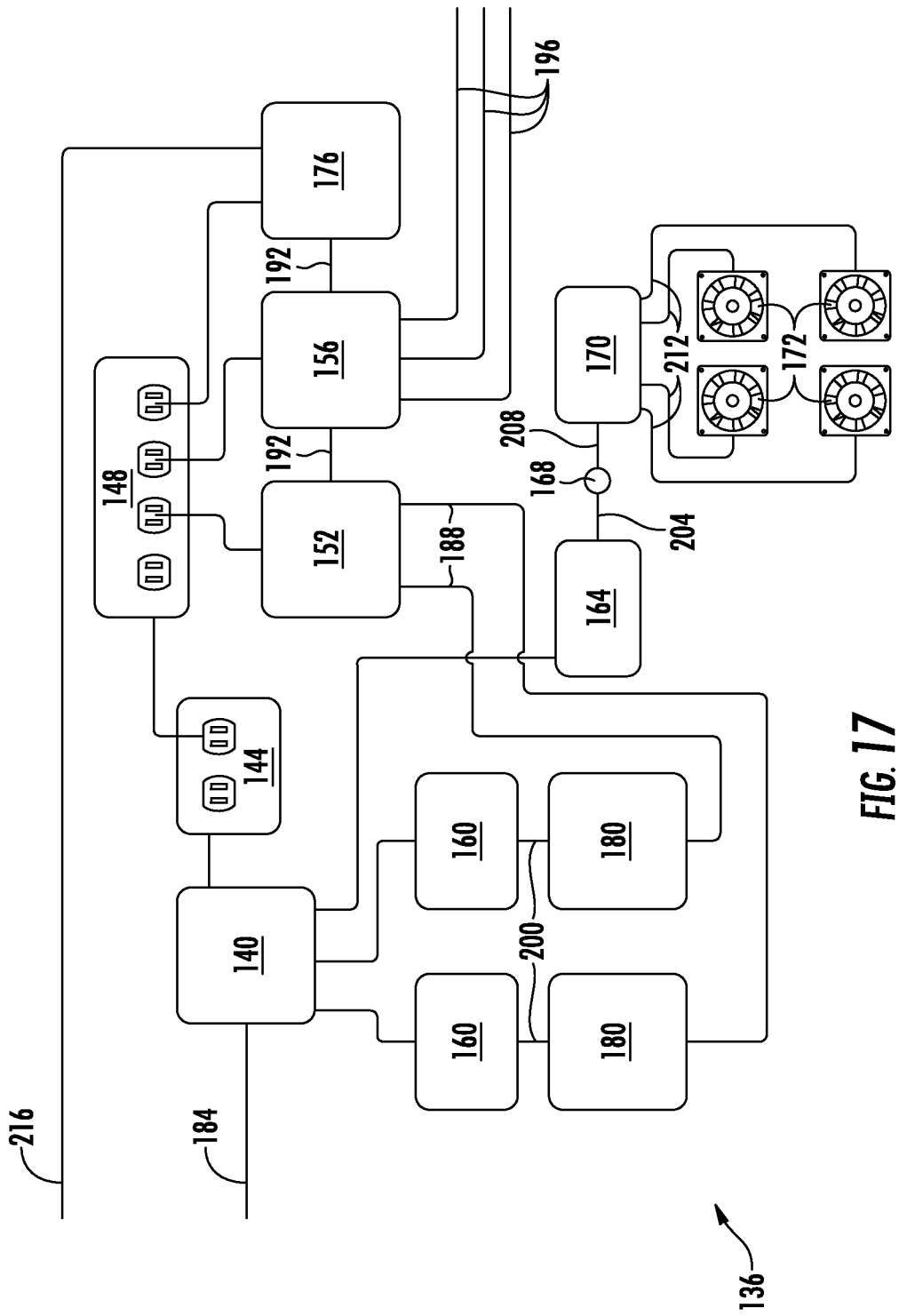
FIG. 17 is a schematic representation of another display system according to one embodiment.
Figure 18:
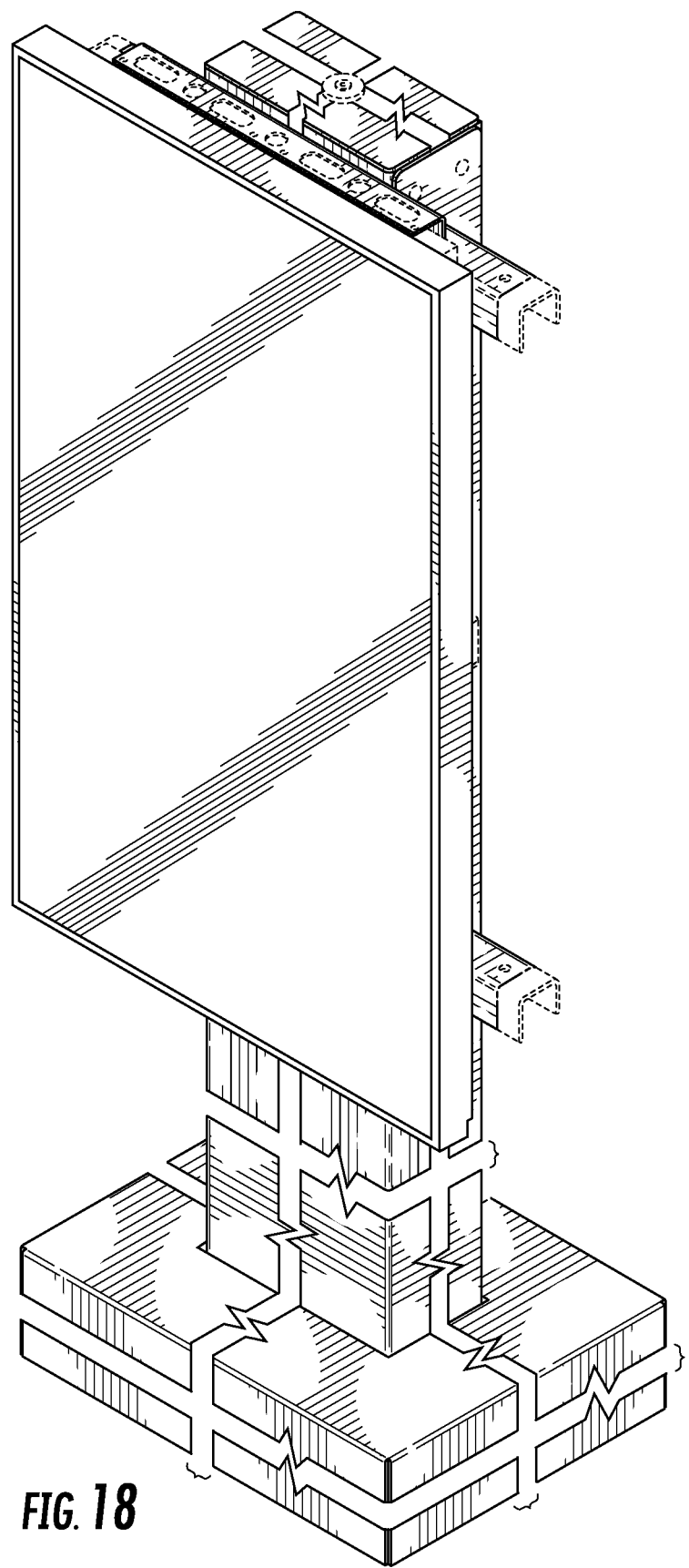
FIG. 18 is a front, right, top, perspective view of an ornamental design for a display system according to one embodiment.
Figure 19:
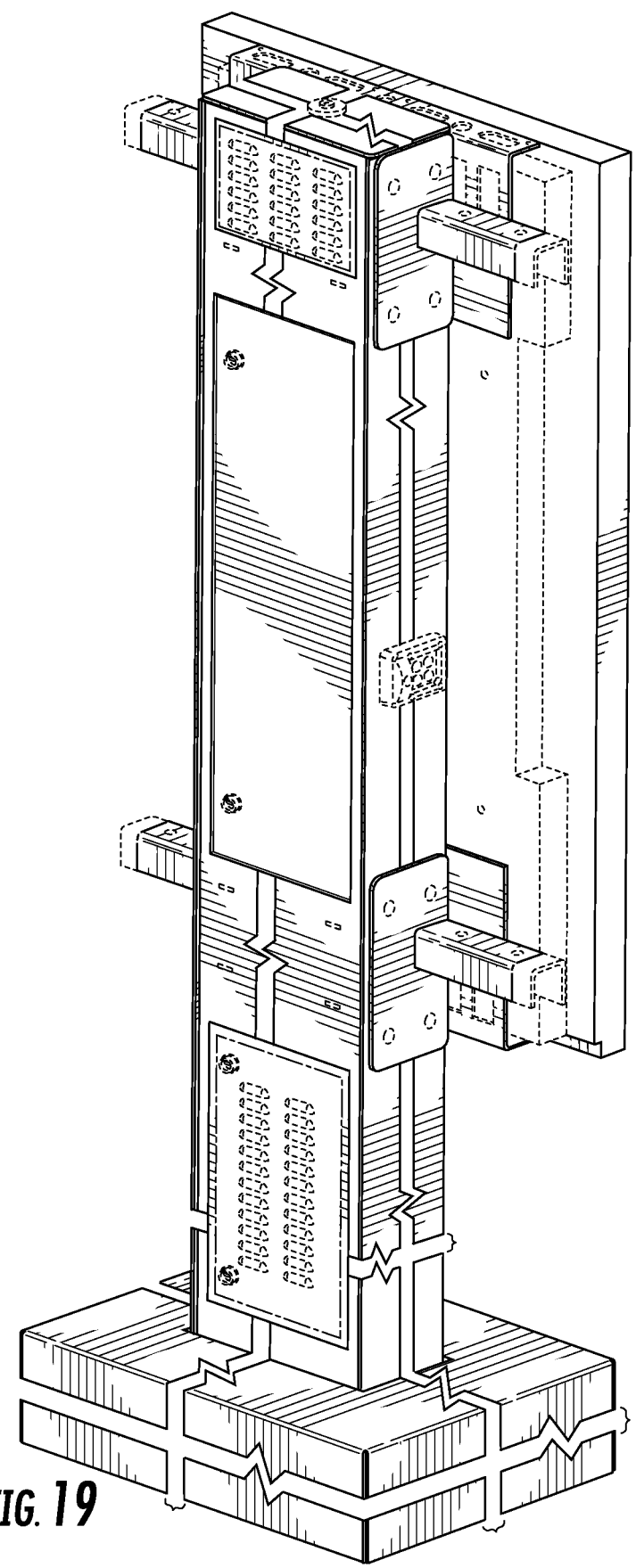
FIG. 19 is a back, left, top perspective view of the display system of FIG. 18.
Figure 20:
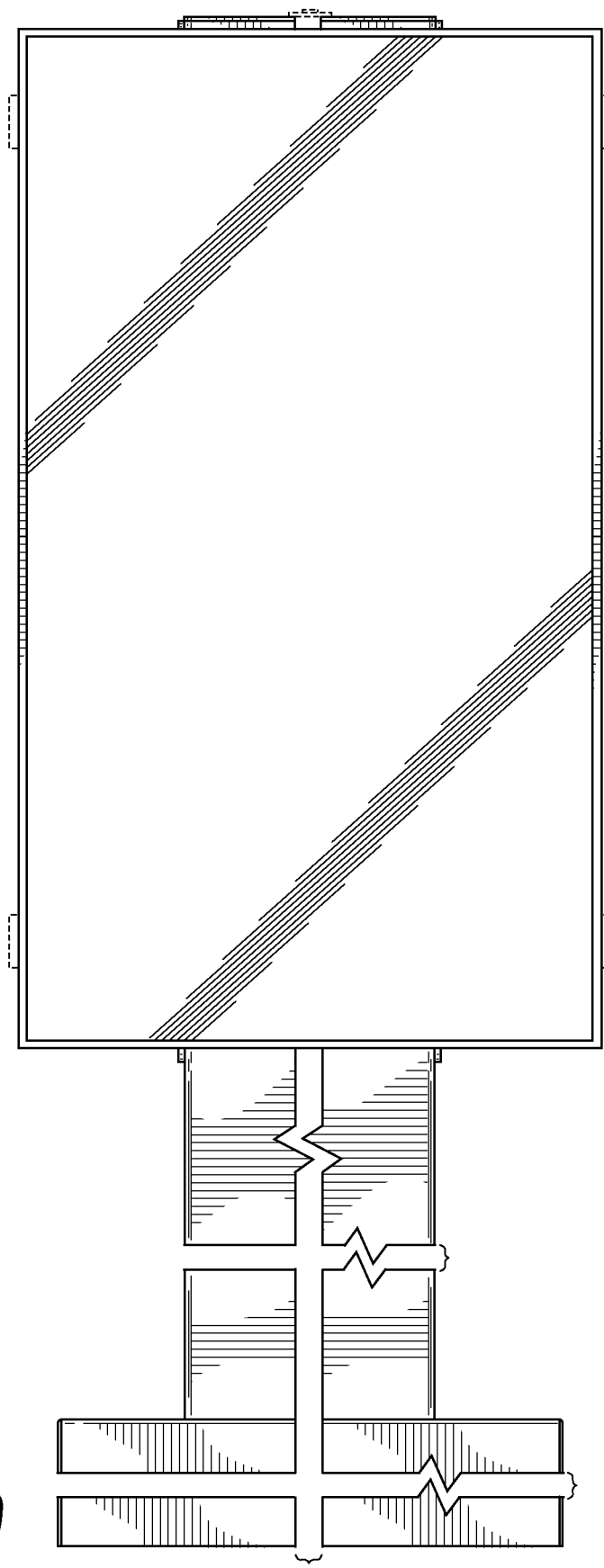
FIG. 20 is a front view of the display system of FIG. 18.
Figure 21:
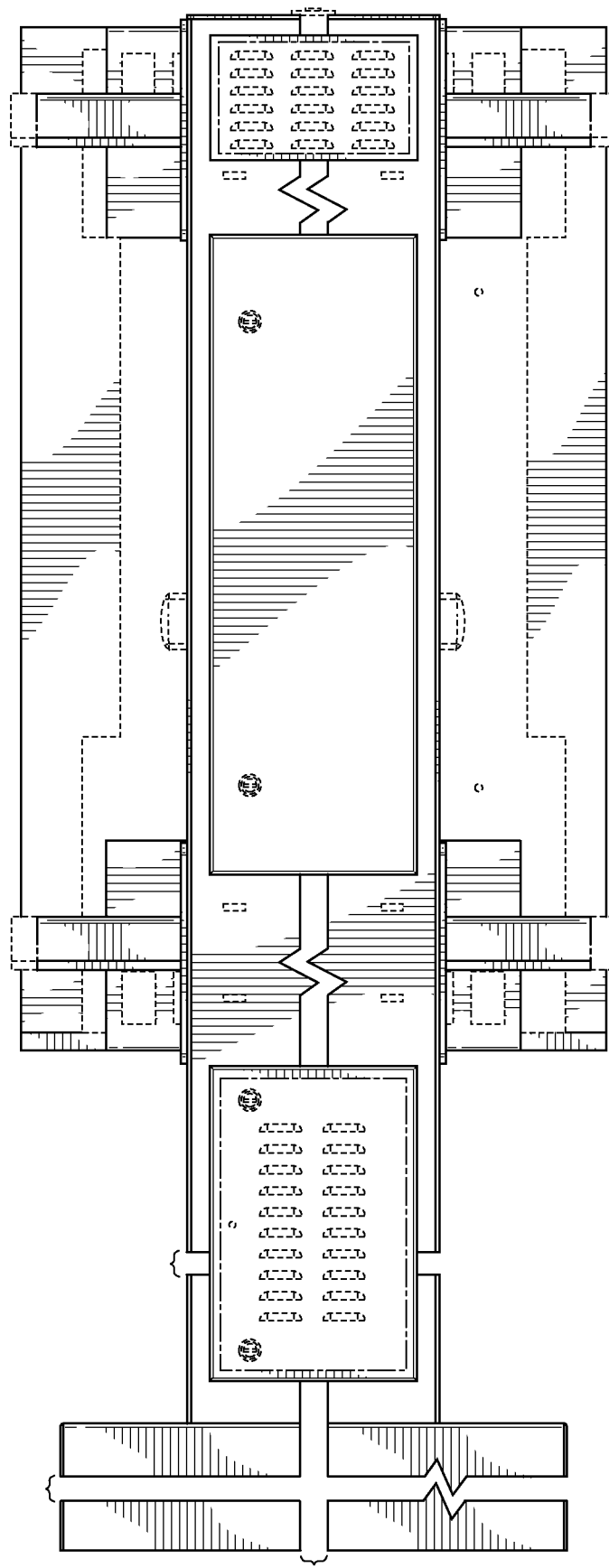
FIG. 21 is a back view of the display system of FIG. 18.
Figure 22:
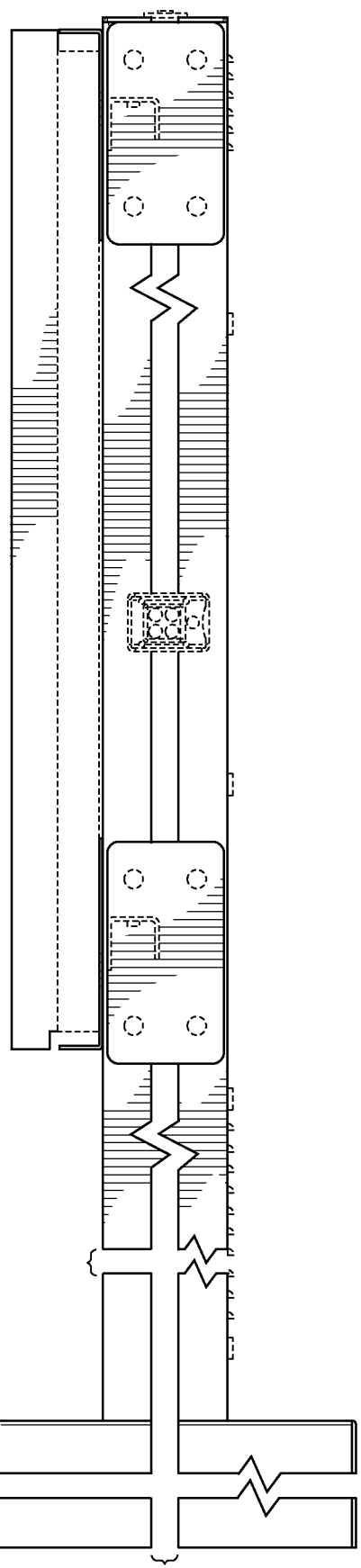
FIG. 22 is a right view of the display system of FIG. 18.
Figure 23:
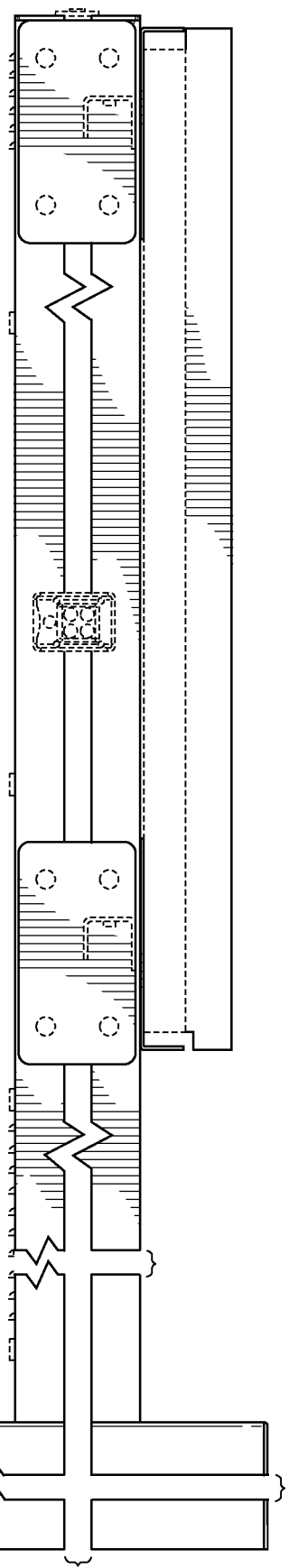
FIG. 23 is a left view of the display system of FIG. 18.
Figure 24:
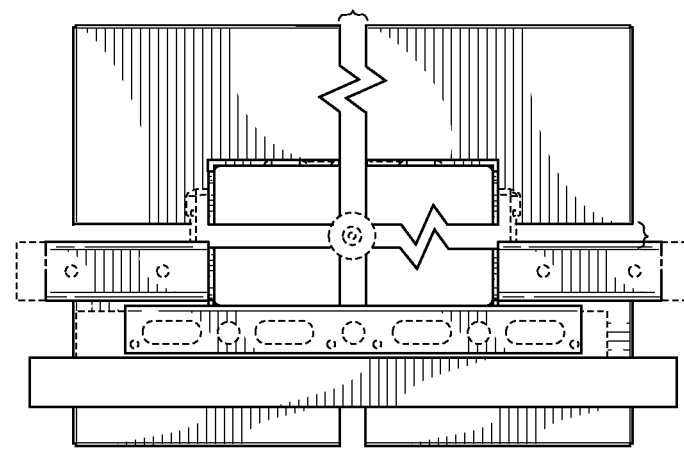
FIG. 24 is a top view of the display system of FIG. 18.
Figure 25:
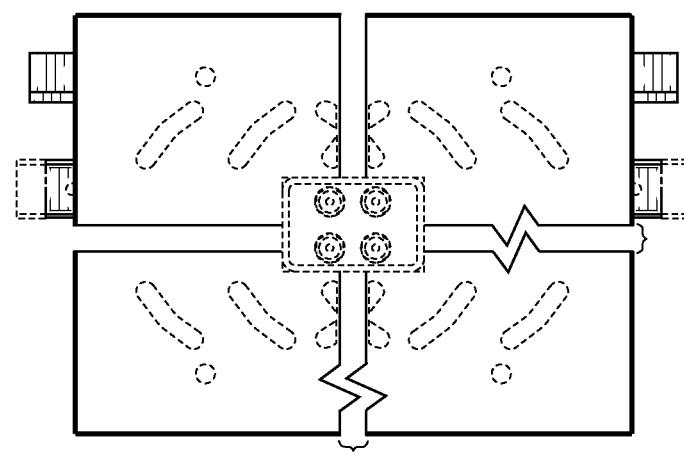
FIG. 25 is a bottom view of the display system of FIG. 18.
Figure 27:
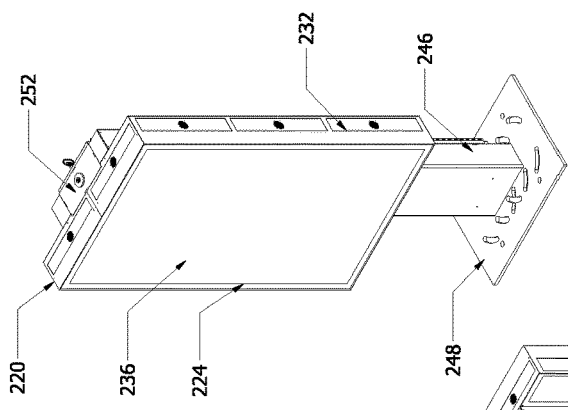
FIG. 27 is a left front perspective view of an embodiment of the display system.
Figure 26:
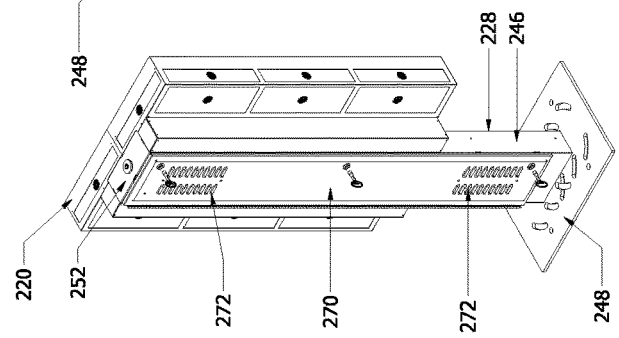
FIG. 26 is a right rear perspective view of an embodiment of the display system.
Figure 31:
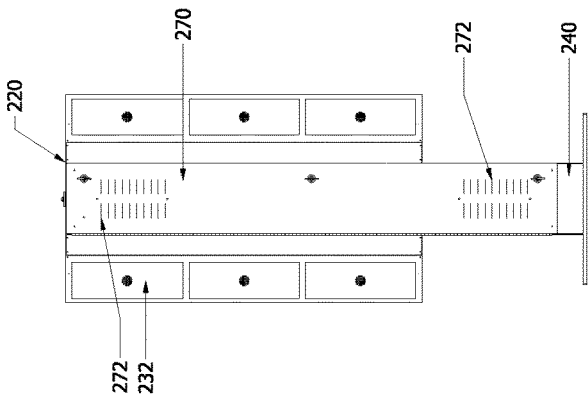
FIG. 31 is a front elevational view of an embodiment of the display system.
Figure 30:
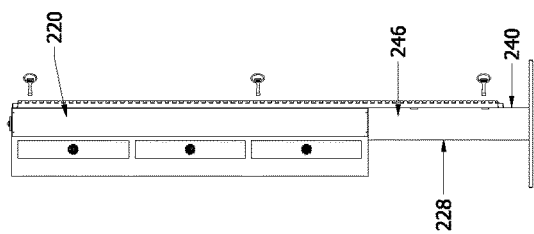
FIG. 30 is a side elevational view of an embodiment of the display system.
Figure 32:
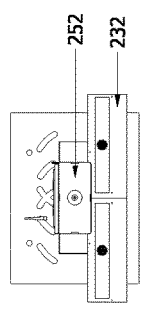
FIG. 32 is a top plan view of an embodiment of the display system.
Figure 29:
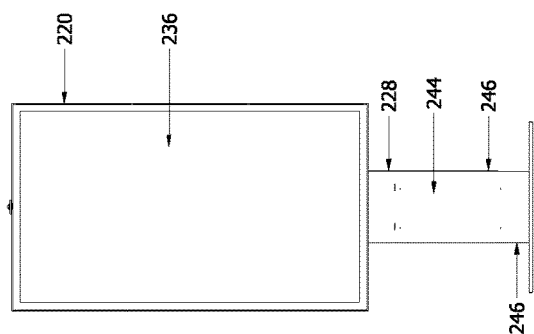
FIG. 29 is a rear elevational view of an embodiment of the display system.
Figure 28:
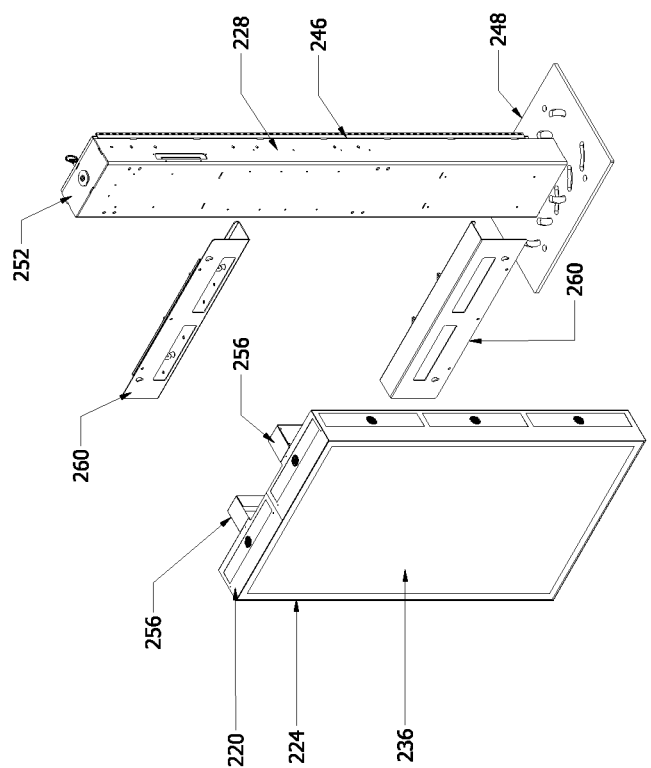
FIG. 28 is an exploded left front perspective view of an embodiment of the display system.
Figure 33:
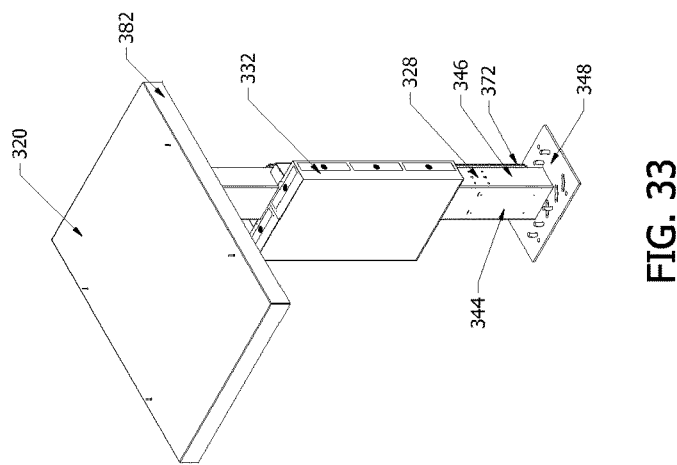
FIG. 33 is a right front perspective view of the canopy embodiment of the display system.
Figure 34:
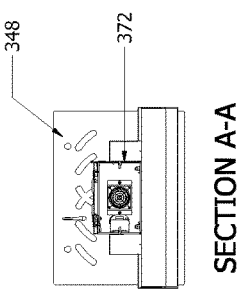
FIG. 34 is a sectional view of the canopy embodiment of the display system at line 34-34 of FIG. 33.
Figure 35:
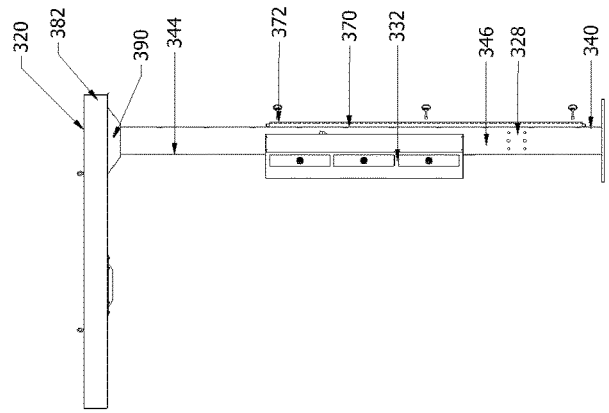
FIG. 35 is a side elevational view of the canopy embodiment of the display system.
Figure 36:
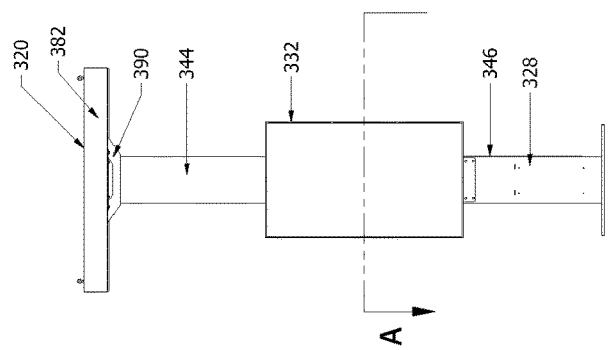
FIG. 36 is a rear elevational view of the canopy embodiment of the display system.
Figure 37:
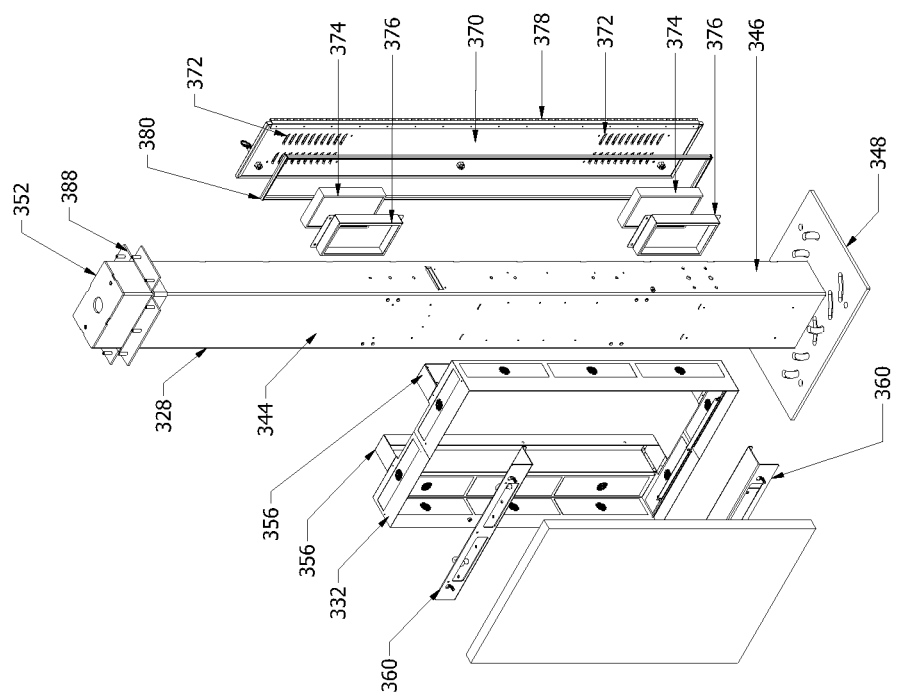
FIG. 37 is an exploded perspective view of the pedestal and display housing structures for the canopy embodiment of the display system.

An exemplary control circuit 136 is shown in FIG. 17. The control circuit 136 may be used in any of the display systems 20, 20′, 20″ discussed above and includes a termination box 140, a junction box 144, a power strip 148, a media player 152, a router 156, two monitor power supplies 160, a DC power supply 164, a thermostat 168, a terminal box 170, four fans 172, a fiber converter 176, and two monitors 180. The monitors 180 may be large format displays (e.g., the large format display 24), and the system may be arranged with one or more monitors 180, as desired.

The termination box 140 is arranged to receive external power in the form of line power 184 (e.g., 110 VAC or 220 VAC) and is in electrical communication with the junction box 144, the monitor supplies 160, and the DC power supplies 164. In one embodiment, the termination box is the junction box 108″ discussed above.

The junction box 144 may be a 4-plex junction box and provides power to the power strip 148. In one embodiment, the junction box 144 is the main circuit connection 100″ discussed above. The power strip 148 distributes line power to the media player 152, the router 156, and the fiber converter 176. In one embodiment, the power strip 148 is the surge protector outlet strip 92″ discussed above.

The media player 152 receives power from the power strip 148 and delivers image signals to the monitors 180 via cables in the form of DVI cables 188. In other embodiments, different cable types may be used to transmit signals between the monitors 180 and the media player 152. In one embodiment, the media player 152 includes industrial PCs 84″ as discussed above. For example, one media player 152 may be provided for each monitor 180, or the media player 152 may provide signals to more than one monitor 180. In some embodiments, the media player 152 is another type of controller, processor, or computing device, as desired.

The router 156 is in communication with the media player 152 and the fiber converter 176 via cables in the form of CAT5e cables 192. In other embodiments, different cable types may be used to transmit signals between the router 156, the media player 152, and the fiber converter 176. The router 156 is also in communication with a remote network, in the form of a patch panel or and external antenna via cables in the form of DVI cables 196. In other embodiments, different cable types may be used for communication with the router 156.

The monitor power supplies 160 receive power from the termination box 140 and provide conditioned power to the monitors 180 via low voltage wires or cables 200. In some embodiments, the monitor power supplies 160 may be housed within a housing of the monitor 180 (e.g., the housing 32 of the large format display 24). In other embodiments, the monitor power supplies 160 may be housed within a support structure (e.g., the column 28). In some embodiments, each monitor power supply 160 provides power to more than one monitor 180.

The DC power supply 164 receives line power from the termination box 140 and converts the line power to a conditioned DC power that is provided to the thermostat 168 via a low voltage wire or cable 204. The thermostat 168 monitors the temperature of the control circuit 136 and operates the fans 172 to maintain the temperature within a desired temperature range. When the thermostat 168 determines that cooling is needed power is delivered via low voltage wire or cable 208 to the terminal box 170 where the power signal is then distributed via low voltage wires or cables 212 to the fans 172. The fiber converter 176 receives a fiber optic cable 216 and is configured to interpret signals received from the fiber optic cable 216 and deliver the interpreted signals to the media player 152 so they may be displayed on the monitors 180.

In one embodiment, all components of the control circuit 136 are housed in the column 28 except the monitors 180. The monitor 180 may be the LED board 36, and the low voltage wire or cable 200 and the DVI cables 188 may run between the housing 32 and the column 24 via the communication port 124 in the column 28.

In one embodiment, the thermostat 168 operates the fans 172 such that the fans 172 run substantially continuously. The thermostat 168 may be a pulse width modulated (PWM) thermostat that can control the fans 172 at a number of different speeds. For example, a minimum speed may be maintained at all times, and in times of cooling demand, the thermostat 168 operates the fans 172 at a high speed or any speed higher than the minimum speed as demanded by the level of required cooling. Continuously maintaining the fans 172 at a minimum speed may be especially advantageous in cold climates where snow and ice are an issue and may tend to cause the freezing of fans and other system components. In one embodiment, the fans 172 are operated at a minimum speed to avoid freeze up, and are operated at a maximum speed when the temperature of the control circuit 136 reaches ninety degrees (90.degree.) Fahrenheit.

In one embodiment, most of the control circuit 136 may be housed in a remote location such as in a store or a quick service restaurant, and only the power components, fans, fiber converter, and the media player are positioned within the column. In other embodiments, different combinations of components may be included in the control circuit. For example, in some embodiments, the industrial PC(s) may be eliminated and information is sent directly to the monitors or large format displays. In some embodiments, the industrial PC(s) may be replaced with another controller, computing device, or processing circuit, as desired. In still other embodiments, various components of the control circuit may be housed in either the large format display or the support structure. The flexibility of the system allows for installation at a variety of locations with different demands. In some locations, the system may require other components not discussed herein that may be housed in the large format display or the support structure.

The column is arranged such that a positive pressure is maintained within the column such that particulate and moisture migration into the column is minimized. Additionally, the gussets and vents are arranged such that in the event of water migration (e.g., during an extreme weather event) the moisture will evaporate in an acceptable time frame to still meet IP56 standards for weatherproofing.

The above embodiments provide a number of advantages including the ability to provide a single column or support structure that houses control components and allows for simple and effective adjustment of the display layout and configuration. For example, the same column may be used for a single wide, a double wide, and the three wide display, as shown in FIGS. 1-15 discussed above. Additionally, the column may be easily adjusted to support other layouts including landscape type displays and more than one row of displays. For example, a 2.times.2 display layout could easily be achieved using the same column as might be used for a 1.times.1 layout. This provides a great amount of flexibility and cost savings when implemented. For example, a user of the display system may easily upgrading a single wide display to a three wide display without significant work and reconfiguration.

FIGS. 18-25 illustrate an embodiment of an ornamental design of a display board system or display system. Other embodiments of ornamental designs of display systems include embodiments similar to FIGS. 18-25 with two display panels or large format displays as in FIGS. 6-10, with three display panels or large format displays as in FIGS. 11-15, and the support column on its own.

FIG. 26-33 illustrate an alternative embodiment of the display system which utilizes a tower, sometimes column or pedestal, with sufficient strength in the lower front and side walls and partial rear walls formed and arranged as flanges that, when coupled with a vented, substantially full height, door.

A display system 220 is adapted to support a large format display 224 on a support column 228, which could be referred to as a column, tower or pedestal 228. Column 228 supports housing 232 which contains LED board 236. It will be noted that column 228 provides structural support for housing 232 while having a considerably narrower width providing advantages including reduced wind resistance, greater clearance around the lower portion, and by providing a plenum for cooling air, the flow being enhanced by the narrower, taller arrangement, as has been and will be further described.

Column 228 has an external upright back 240 opposed from a main upright front 244 separated by integral side walls 246. Column 228 is advantageously mounted to base plate 248 which has a bolt pattern permitting the completed display system 220 to be mounted to an appropriate anchoring fixture. Top cap 252 closes column 228 making it waterproof at the top. Appropriate mounting arm brackets 256 may be adapted to mounting arms 260 or other mechanical attachment to housing 232.

Door panel 270 is arranged to have top and bottom vents 272. Vents are preferably fitted with filters that provide, in combination with the pressure arrangement described to provide the weather protection desired. The combination may be used to provide IP56 weatherproofing standards for water and particulate intrusion resistance.

In an alternative embodiment the previously described industrial PCs 84", network switch 88", surge protector outlet strip 92", cooling fans 96", main circuit connection 100", power supply 104", junction box 108", apertures 112", 116" and 120" can all be formed and arranged within column 228. The interaction between vents 272 and fans 96" controlled by thermostat 168 functions to provide consistent cooling air flow in the weather resistant structure, Column 228 components back 240, front 244, side walls 246 and top cap 252 provide a structure open to receive door 270 which interacts with seal 280 against mating panels of back 240 to provide weather resistance when door 270 is closed and secured. The full height of door 270 provides consistent control over the vertical arrangement of vents 272 relative to one another, ease of inspecting and replacing filters and ease of installation and servicing of the wiring, electrical and electronic components described.

In FIG. 33-37, in the canopy embodiment, column 328 has an external upright back 340 opposed from a main upright front 344 separated by integral side walls 246. Column 328 is advantageously mounted to base plate 348 which has a bolt pattern permitting the completed display system 320 to be mounted to an appropriate anchoring fixture. Top cap 352 closes column 328 making it waterproof at the top, even before attachment of canopy 382. Appropriate mounting arm brackets 356 may be adapted to mounting arms 360 or other mechanical attachment to housing 332.

Door panel 370 is arranged to have top and bottom vents 372. Vents 372 are preferably fitted with filters 374 in filter housings 376 that provide, in combination with the pressure arrangement previously described to provide the weather protection desired. The combination may be used to provide IP56 weatherproofing standards for water and particulate intrusion resistance. Door panel 370 can be mounted on hinge 378 and close on seal apparatus 380 secured with fasteners to maintain the requisite integrity for column 328 to function as a plenum.

Canopy 382 is particularly advantageous when display system 320 is used in a location such as a restaurant drive through where a customer is provided with increased weather protection. Canopy attachment of canopy 382 to column 328 which may be accomplished by flanges 388. An angled trim piece 390 could be used. Improved strength could be achieved by converting trim piece to a structural piece oriented to spread canopy load over a wider area and then down to column 328.

Figure 38:
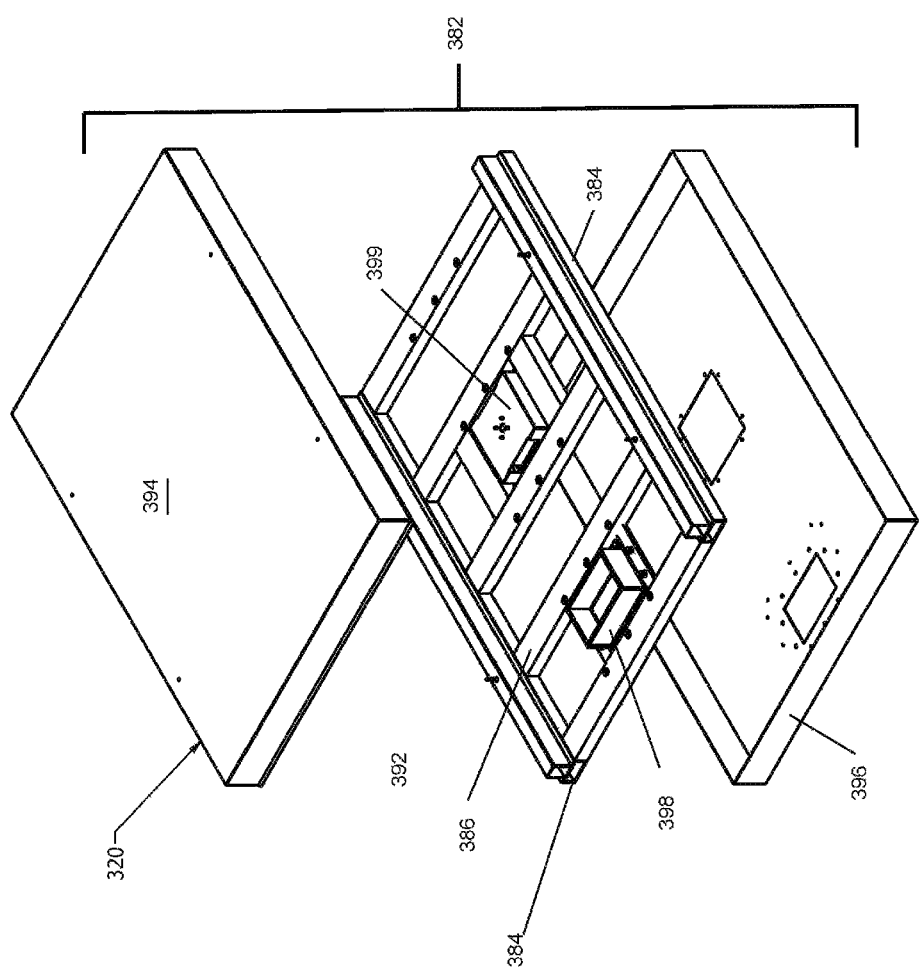
FIG. 38 is a perspective view of the canopy structure of the display system.

Column 328 has been extended vertically higher than the top of housing 332 so that canopy 382 can be mounted. FIG. 38 shows the canopy 382 with frame 392 having stringers 384 and beams 386 which provide structure for the canopy, which may be advantageously formed of a relatively lighter material than column 328 such as Aluminum as compared to steel. Roof 394 provides weather protection and bottom panel 396 can be advantageously formed to provide aesthetic and weather protection from below, having a port for column 328 and a receptacle 398 to mount tower and flanges 388 and a port for a light fixture 399. Different or no lighting could be adapted.

Structural changes in column 328 compared to column 272 may include increasing column "footprint" to 6 inches× 10 inches, (152.4 mm×254 mm) increasing wall thickness about 40% and increasing height by about thirty four inches (863.6 mm) in addition to adding the top mounting flanges 388.

The construction and arrangements of the display system, as shown in the various exemplary embodiments, are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Some elements shown as integrally formed may be constructed of multiple parts or elements, the position of elements may be reversed or other varied, and the nature or number of discrete elements or positions may be altered or varied. The order or sequence of any process, logical algorithm, or method steps may be varied or re-sequenced according to alternative embodiments. Other substitutions, modifications, changes and omissions may also be made in the design, operating conditions and arrangement of the various exemplary embodiments without departing from the scope of the present invention. As to the manner of usage and operation of the present invention, the same should be apparent from the above description. Accordingly, no further discussion relating to the manner of usage and operation will be provided.

While a number of exemplary embodiments of the display system have been described in detail, it should be apparent that modifications and variations thereto are possible, all of which fall within the true spirit and scope of the invention. With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

While best mode and preferred embodiment has been set forth, the scope of the invention is not limited thereto, but rather by the scope of the attached claims.

The invention claimed is:

1. An outdoor display mounting apparatus to support a display board housing adapted to providing cooling air flow for said display board for both electronically generated and meteorologically and climatic generated heat comprising:

two separate weather resistant structures for containing separate electronic components namely an upright tower and said display housing;

said upright tower is adapted to support said display housing in ambient meteorological and climatic conditions elevating said housing above ground level;

said display housing is adapted to receive an electrically powered and electronically controlled display board;

said tower having a tower width, a tower depth and a tower height;

said tower width being greater than said tower depth by a first ratio;

said housing having a housing width, a housing depth and a housing height;

said housing width being greater than said housing depth by a second ratio;

said first ratio being less than said second ratio;

said tower width being less than said housing width and said tower height being greater than said housing height such that said tower extends at least to the top of said housing;

said tower having a forward surface and a rear surface, and left and right side surfaces interconnecting said forward surface and a rear surface, left and right side edges defining said interconnection;

said surfaces defining a chamber;

said chamber being adapted to contain a computer adapted to control said display board;

said chamber being adapted to contain a power supply adapted to power said display board;

said computer and power supply creating a heat source separate from said electronic display board;

said rear surface being formed and arranged to define at least one aperture;

closure for said aperture being formed and arranged to define a top vent and a bottom vent;

said rear surface defining a plane;

said top vent and bottom vent being oriented one vertically above the other in the same plane;

said chamber being adapted to contain a fan to move cooling air so as to transmit heat from said computer and power supply exterior to said chamber;

said cooling air traveling on a path passing generally horizontally after passing through said bottom vent, generally vertically past said heat source, and generally horizontally to exit said top vent, said generally vertical path being a substantially exclusive vertical path with no substantial direction changes proximate said horizontal paths;

said tower further extending vertically higher than said display housing and having a canopy mount affixed thereto; said mount supporting a canopy in a cantilevered fashion.

2. The display mounting apparatus of claim 1, said rear surface being non-continuous and openable, said vents being fitted with filters.

3. The display mounting apparatus of claim 2, said fan being controlled so as to operate continuously at or above a non-zero minimum speed so that a positive pressure is maintained within the chamber between the first vent and the second vent.

4. The display mounting apparatus of claim 2, wherein the computer is mounted vertically above the fan.

5. The display mounting apparatus of claim 2, further comprising a second computer mounted within the tower between the first vent and the second vent; and a second large format display coupled to a mounting arm and receiving signals from the second computer.

6. The display mounting apparatus of claim 2, further comprising a third industrial PC mounted within the upright column between the first vent and the second vent; and a third large format display coupled to a mounting arm and receiving signals from the third industrial PC.

7. The display mounting apparatus of claim 2, wherein a thermostat controls the fan at the non-zero minimum speed when an ambient temperature is below about forty degrees Fahrenheit and at a maximum speed when the ambient temperature is above about ninety degrees Fahrenheit.

8. The display mounting apparatus of claim 2, wherein the thermostat is pulse-width-modulated.

9. An outdoor display system comprising:

an upright pedestal meeting IP56 weatherproofing standards and including a first vent for intake and a second vent for exhaust;

said upright pedestal having a vertically oriented axis on a rear surface;

said second vent is formed and arranged so as to be connected to said pedestal vertically above said first vent and on said axis;

a mounting arm coupled to the upright pedestal;

a controller mounted within the upright pedestal above the first vent;

a continuously operational fan mounted within the upright pedestal adjacent the vent;

a large format display housing, separate from said pedestal, adapted to contain an electronic display board and to convey display board and environmentally generated heat outside of said housing to the ambient environment, said housing mounted to the mounting arm and said electronic display board being adapted to receive signals from the controller;

said pedestal rear surface being non-continuous and openable, said pedestal vents being fitted with filters;

controller cooling air entering said first pedestal vent flowing horizontally inwardly, substantially the entire flow volume turning vertically upwardly in a vertical path, said vertical path including a component of positive pressure imparted by said fan, substantially the entire volume of said vertical path turning horizontally outwardly to exit said second pedestal vent;

said pedestal extending vertically higher than said display housing and having a canopy mount affixed to said pedestal;

said mount supporting a canopy in a cantilevered fashion.

10. The display system of claim 9, wherein the fan operates between a minimum speed and a maximum speed to maintain a positive air pressure within the upright pedestal.

11. The display system of claim 9, further comprising a thermostat that controls the fan at a non-zero minimum speed when an ambient temperature is below about forty degrees Fahrenheit and at a maximum speed when the ambient temperature is above about ninety degrees Fahrenheit.

12. The display system of claim 9, further comprising a second controller mounted within the upright pedestal above the vent; and a second large format display coupled to the mounting arm and receiving signals from the second controller.

13. The display system of claim 9, further comprising a third controller mounted within the upright pedestal above the vent; and a third large format display coupled to the mounting arm and receiving signals from the third controller.

14. The display system of claim 9, further comprising a router providing communication between a remote network and the controller.

15. An outdoor display system comprising:
a column configured to support one or more large format display board housings containing one or more electronic display boards;
said housings being structurally separable from said column and being independently weather resistant and having independent cooling flow to control heat proximate said display boards;
said display boards and housings are thermally separate from said column;
said column being sealed so as to be weather resistant and including a first vent for intake and a second vent for exhaust;
said column having an axis perpendicular to the horizon;
said second vent is formed and arranged so as to be connected to said column vertically above said first vent on said axis;
a controller mounted within the column and configured to send display signals to the one or more large format displays mounted within said one or more display board housings;
a fan mounted within the column and positioned vertically below the controller, the fan operating continuously at or above a non-zero minimum speed to maintain a positive pressure within the column imparting pressure in an upward flow turning to a horizontal exit flow without substantial directional diversion between said vertical and horizontal exit flow;
said column having a non-continuous and openable rear portion containing one or more of said column vents, said column vents being fitted with filters;
said column extending vertically higher than said display housing and having a canopy mount affixed thereto;
said mount supporting a canopy in a cantilevered fashion.

16. The display system of claim 15, wherein the one of said vents is positioned lower than the controller.

17. The display system of claim 16, further comprising: a speaker mounted within the column and receiving audio signals from the controller; a router providing communication between a remote network and the controller; a thermostat that controls the fan at the non-zero minimum speed when an ambient temperature is below about forty degrees Fahrenheit and at a maximum speed when the ambient temperature is above about ninety degrees Fahrenheit.

* * * * *